Feb. 22, 1966 S. GHAEM-MAGHAMI 3,237,106

UHF CONVERTER CIRCUIT ARRANGEMENT

Filed Feb. 1, 1963

INVENTOR:
SANJAR GHAEM-MAGHAMI,

BY Frank J. Thompson

HIS ATTORNEY.

United States Patent Office 3,237,106
Patented Feb. 22, 1966

3,237,106
UHF CONVERTER CIRCUIT ARRANGEMENT
Sanjar Ghaem-Maghami, Clay, N.Y., assignor to General Electric Company, a corporation of New York
Filed Feb. 1, 1963, Ser. No. 255,619
3 Claims. (Cl. 325—439)

Figure 1:
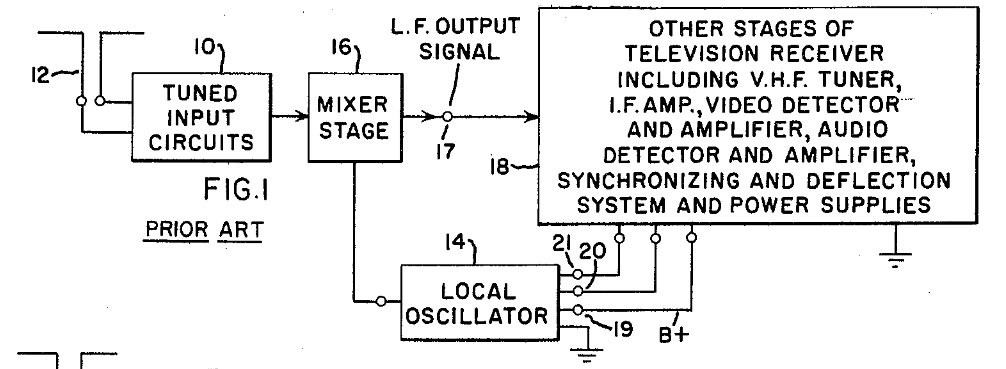

This invention relates to frequency converter circuit arrangements of the type which selectively tune RF signal frequencies in an Ultra High Frequency band and convert the tuned signal frequencies to a desired intermediate frequency. The present invention relates more particularly to an improved circuit arrangement for injecting into a mixer stage of the converter, a signal which is generated by a local oscillator stage of the converter.

Converter circuit arrangements for tuning electrical signals in the UHF band, as for example in the 470 mc. to 890 mc. frequency range which is the band presently assigned to broadcast television service, generally include an input circuit stage, a local oscillator stage, and a mixer stage. RF signal frequencies which are selectively tuned by the input stage are heterodyned in the mixer stage with a signal which is derived from the oscillator stage to provide a desired intermediate frequency output signal.

The signal frequencies tuned are relatively high and consequently the operation and construction of the converter circuit and in particular the local oscillator stage is relatively critical. More specifically, one area of circuit criticality resides in the means for deriving the oscillator signal from the local oscillator stage and injecting the signal into the mixer stage. At the UHF frequencies, lumped circuit means for providing the injection exhibit electrical characteristics which vary with frequency and cause differing loading affects on the oscillator stage when different RF frequencies are tuned. The variation in loading results, at times, in an undesirable variation in amplitude of this oscillator injection voltage and in a shift in the generated frequency. The frequency shift can be of a magnitude which undesirably inhibits a tuning of the entire frequency band.

For providing signal injection while simultaneously reducing the affect of loading on the oscillator, it has been proposed to derive the locally generated signal from a cathode heater-filament of an electron discharge amplifying device in the oscillator stage. Although the heater-filament is not connected in the oscillator circuit loop of the amplifying device, stray coupling between the heater-filament and other electrodes of the amplifying device establish the heater-filament as a suitable source of oscillator signal. First and second capacitors of relatively low capacitance isolate the filament voltage and couple the oscillator signal via a resistive impedance from the filament to a first electrode of a diode mixing element in the mixer stage. Because of the high frequencies involved, small variations in the physical placement and lead dress of the capacitors cause significant variations in the amount of signal coupling and injection. Consequently, in manufacturing converters utilizing this arrangement and having consistent electrical characteristics, a high degree of care in fabrication is required and the arrangement is thus relatively expensive and difficult to manufacture by production line techniques. In electrical apparatus such as television receivers where cost is of primary importance, the addition of two capacitors and the care required in assembly undesirably increases the cost of the apparatus.

Accordingly, it is an object of this invention to provide an improved signal coupling and injection circuit arrangement for a UHF converter.

Another object of this invention is to provide a signal coupling and injection circuit for a UHF converter which is less critical in assembly than prior arrangements.

Another object of the invention is to provide a coupling and signal injection means for a UHF converter which requires fewer components than prior arrangements.

Prior local oscillator circuit arrangements of the type referred to have included a separate resistive impedance means for establishing a direct-current potential and a bias voltage at a control electrode of the amplifying device.

This invention has as another object, the provision of an oscillator signal coupling and injection circuit means which provides a direct-current potential and a grid-leak bias impedance for a control electrode of the amplifying device in the oscillator stage.

Still another object of the present invention is to provide oscillator signal coupling and injection circuit means having an impedance for simultaneously coupling a locally generated signal to the mixer stage, coupling a direct-current potential to a control electrode of the oscillator, and for providing a grid-leak bias impedance for the control electrode.

In accordance with the present invention, a UHF converter circuit arrangement is provided having mixer and local oscillator stages. The oscillator stage includes an electron discharge amplifying device having anode, cathode and control electrodes. First means couple oscillator frequency determining means between the anode,, cathode, and control electrodes of the amplifying device. The first coupling means includes a grid-leak bias capacitor connected to the control electrode. Resistive impedance means are provided and direct-current couple the control electrode of the amplifying device and a first electrode of a diode mixing element in the mixer stage. The resistive impedance simultaneously couples a direct-current potential which is established at the first electrode to the control electrode, provides a grid-leak bias resistive impedance for the amplifying device, and provides coupling and injection of the locally generated signal from the oscillator to the mixer stage.

Figure 2:
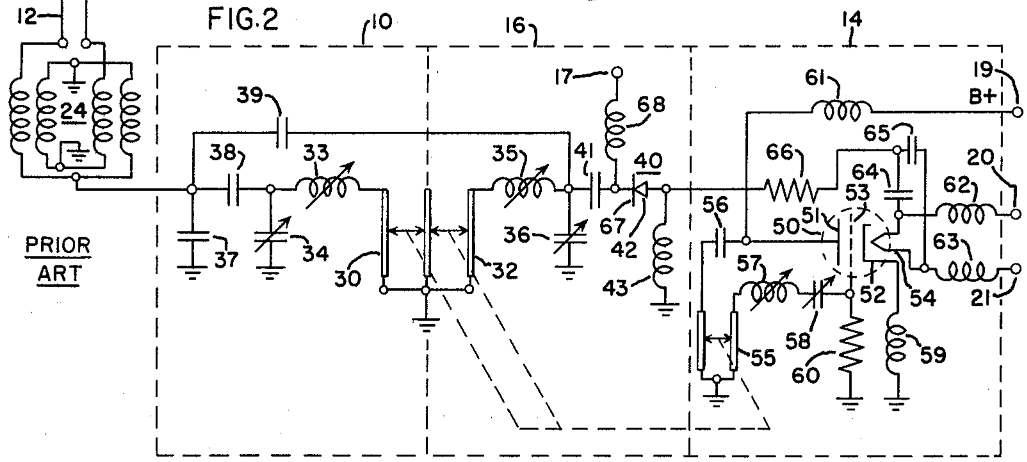
Figure 3:
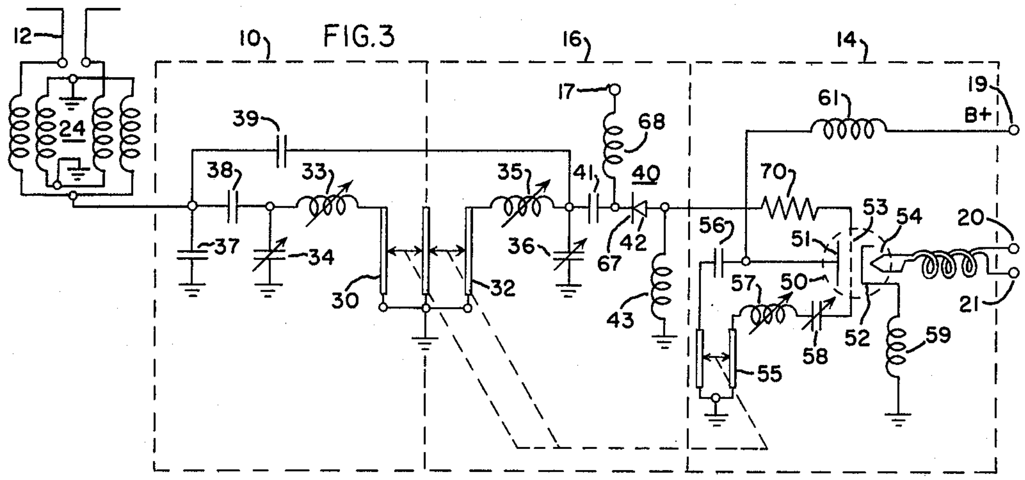

Further objects, features and the attending advantages of the present invention will become apparent with reference to the following specifications and drawings in which:

FIGURE 1 is a block diagram of a television receiver utilizing a UHF converter and illustrating the different stages of the converter, FIGURE 2 is a schematic diagram of a known UHF converter circuit arrangement for use in the system of FIGURE 1, and FIGURE 3 is a schematic diagram of a UHF converter circuit arrangement for use in the system of FIGURE 1 and utilizing an embodiment of the present invention.

Reference is now made to FIGURE 1 for a brief description of the general arrangement and operation of a television receiving apparatus suitable for tuning RF signals in the UHF band. The UHF converter is shown to include a tuned input circuit stage 10 for selecting desired RF signal frequencies which are induced in an antenna 12, a local oscillator stage 14 for generating a signal to be heterodyned with the tuned RF signal frequencies, and a mixer stage 16 for heterodyning the RF and locally generated signal to provide an intermediate frequency output signal. The intermediate frequency signal exists at an output terminal 17 of the mixer stage and is coupled to other conventional stages of a television receiver which are indicated generally by the block 18. The intermediate frequency signal may have a frequency corresponding to the intermediate frequency of the receiver or a tuned RF frequency of a channel not utilized in a VHF tuner of the receiver. Direct-current anode operating voltage and filament operating voltages are derived from the power supply of the receiver 18 and coupled to input terminals 19, 20 and 21 respectively of the local oscillator 14. The general operation of the television receiving apparatus of FIGURE 1 is conventional and further elaboration is believed unnecessary.

Referring briefly to the prior art UHF converter circuit arrangement shown in FIGURE 2, a signal which is induced in the antenna 12 is coupled via a balun 24 to the input circuit 10. Desired broadcast signals in the UHF band are segregated by a double tuned circuit arrangement comprising the adjustable transmission lines 30 and 32, associated tuner inductance and capacitors 33, 34 and 35, 36 respectively, input capacitors 37 and 38, and neutralizing capacitor 39. The selected frequencies are coupled to a diode mixing element 40 in the mixer stage 16 by a coupling capacitor 41. A direct-current operating potential is established at a first electrode 42 of diode 40 by an inductance 43 coupled to ground potential.

The oscillator stage includes an amplifying device 50 having anode, cathode, and control electrodes 51, 52 and 53 respectively, and a cathode heater-filament 54. Frequency determining means comprising a transmission line 55 and capacitance 56 are provided and coupled to the anode electrode and to the control and cathode electrodes. The transmission line 55 is coupled to the control electrode by the trimmer inductance and capacitance 57 and 58 respectively and to the cathode 52 by a choke 59. A resistor 60 establishes a direct-current potential at control electrode 53 and in cooperation with capacitor 58 provides grid-leak bias for the device. Direct-current operating potential is coupled from terminal 19 by a choke 61 to anode 51 while filament operating voltage is coupled from terminal 20 and 21 by chokes 62 and 63 to heater-filament 54.

As indicated hereinbefore, because of the frequencies involved, an oscillator signal will exist at filament 54 due to stray coupling. Since the filament is not connected in the oscillator loop, an oscillation signal may be derived from the filament without appreciably affecting the operation of the oscillator. Capacitors 64 and 65 isolate the filament voltage and couple the oscillator signal from the filament 54 via a resistive impedance 66 to the first electrode 42 of the diode 40. The tuned RF signal and oscillator signal are heterodyned by the diode and an intermediate frequency signal generated thereby is coupled from a second electrode 67 of the diode to output terminal 17 via a choke 68. As previously indicated, the physical placement of the capacitors 64 and 65 of the oscillator signal coupling circuit is critical and subject to deviation when manufactured by production line facilities.

In accordance with the present invention, a resistive impedance 70 as illustrated in FIGURE 3, is provided and arranged in a manner for direct-current coupling the first electrode 42 of diode 40 and the control electrode 53 of amplifying device 50. Although the resistor 70 is connected to a point in the circuit within the oscillator loop, the arrangement is found to have a negligible loading affect on the oscillator circuit. Since first electrode 42 is maintained at a D.C. potential, the resistive impedance 70 in addition to coupling the oscillator signal from electrode 53 to electrode 42 also couples a direct-current potential to electrode 53 and operates as a resisitive elment in a grid-leak bias arrangement for electrode 53. Since only a single connection is required from the coupling circuit to the control electrode 53, the fabrication of the converter is simplified and less critical. Because the capacitors 64 and 65 and the resistor 60 of the prior art arrangement are no longer required, a considerable cost advantage is provided by the present invention over the prior art.

While I have illustrated and described and have pointed out in the annexed claims certain novel features of my invention, it will be understood that various omissions, substitutions and changes in the forms and details of the system illustrated may be made by those skilled in the art without departing from the spirit and scope of the claims.

What I claim as new and desire to secure by Letters Patent of the United States is:

1. An Ultra High Frequency converter circuit arrangement comprising: a mixer stage including a mixer element having a first electrode and means establishing a direct-current potential at said first electrode; means for selectively tuning a broadcast signal and for coupling the signal to said mixer element; local oscillator means for generating an alternating signal, said oscillator means including an electron discharge amplifying device having a control electrode and a grid-leak bias capacitor coupled to said control electrode; and impedance means coupled between said first electrode and said control electrode for providing a grid-leak resistance, for establishing a direct-current potential at said control electrode and for coupling an oscillator signal to said mixer element.

2. An Ultra High Frequency converter circuit arrangement comprising: a mixer stage including a mixer element having a first electrode and means establishing a direct-current potential at said first electrode; means for selectively tuning a broadcast signal and for coupling the signal to said mixer element; local oscillator means for generating an alternating signal, said oscillator means including an electron discharge amplifying device having a control electrode and a grid-leak bias capacitor coupled to said control electrode; and resisitive impedance means direct-current intercoupling said mixer first electrode and said control electrode.

3. An Ultra High Frequency converter circuit arrangement comprising: a mixer stage including a diode mixer element having a first electrode, means establishing a direct-current potential at said first electrode; means for tuning a broadcast signal in an Ultra High Frequency band and for coupling said signal to said mixer element for heterodyning with a locally generated oscillator signal; a local oscillator comprising an electron discharge amplifying device having anode, cathode and control electrodes; means coupling direct-current operating potential between said anode and cathode electrodes; frequency determining means including a grid-leak capacitor connected to said control electrode for coupling said frequency determining means between said anode, cathode, and control electrode in a manner for causing electrical oscillations to be generated by said oscillator circuit; and a resistor connected between said diode first electrode and said control electrode of said amplifying device.

No references cited.

ROBERT H. ROSE, *Primary Examiner.*